(12) United States Patent
Spyropoulos et al.

(10) Patent No.: US 10,760,944 B2
(45) Date of Patent: Sep. 1, 2020

(54) HYBRID FLOW METROLOGY FOR IMPROVED CHAMBER MATCHING

(71) Applicant: LAM RESEARCH CORPORATION, Fremont, CA (US)

(72) Inventors: Evangelos T. Spyropoulos, San Jose, CA (US); Piyush Agarwal, Sunnyvale, CA (US); James Leung, San Jose, CA (US); Seyed Hossein Hashemi Ghermezi, San Ramon, CA (US); Iqbal Shareef, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 204 days.

(21) Appl. No.: 16/056,980

(22) Filed: Aug. 7, 2018

(65) Prior Publication Data
US 2020/0049547 A1 Feb. 13, 2020

(51) Int. Cl.
*G01F 1/34* (2006.01)
*G01F 25/00* (2006.01)

(52) U.S. Cl.
CPC ............ *G01F 25/0053* (2013.01); *G01F 1/34* (2013.01); *G01F 25/0092* (2013.01); *B01J 2219/00216* (2013.01); *G01F 25/0038* (2013.01)

(58) Field of Classification Search
CPC ... G01F 1/00; G01F 1/34; G01F 25/00; G01F 25/0038; G01F 25/0053; G01F 25/0092; B01J 2219/00216
See application file for complete search history.

(56) References Cited

U.S. PATENT DOCUMENTS

| 7,822,570 | B2 | 10/2010 | Shareef et al. |
| 9,778,083 | B2 | 10/2017 | Spyropoulos et al. |
| 2010/0125424 | A1* | 5/2010 | Ding ................. G01F 25/0053 702/47 |
| 2013/0092243 | A1* | 4/2013 | Mohammed ........ G01F 25/0053 137/2 |
| 2018/0106247 | A1* | 4/2018 | Yamashima .......... G05D 7/0623 |
| 2019/0017855 | A1* | 1/2019 | Sawada .................. G01F 1/34 |
| 2019/0212176 | A1* | 7/2019 | Miyoshi ................... G01F 3/36 |

* cited by examiner

Primary Examiner — Nguyen Q. Ha

(57) ABSTRACT

A gas flow metrology system for a substrate processing system includes N primary valves selectively flowing gas from N gas sources, respectively, where N is an integer. N mass flow controllers are connected to the N primary valves, respectively, to flow N gases from the N gas sources, respectively. N secondary valves selectively flow gas from the N mass flow controllers, respectively. A gas flow path connects the N secondary valves to a flow metrology system located remote from the N secondary valves, wherein the gas flow path includes a plurality of gas lines. A controller is configured to perform a hybrid flow metrology by selectively using a first flow metrology and a second flow metrology that is different from the first flow metrology to determine an actual flow rate for a selected gas at a desired flow rate from one of the N mass flow controllers.

28 Claims, 7 Drawing Sheets

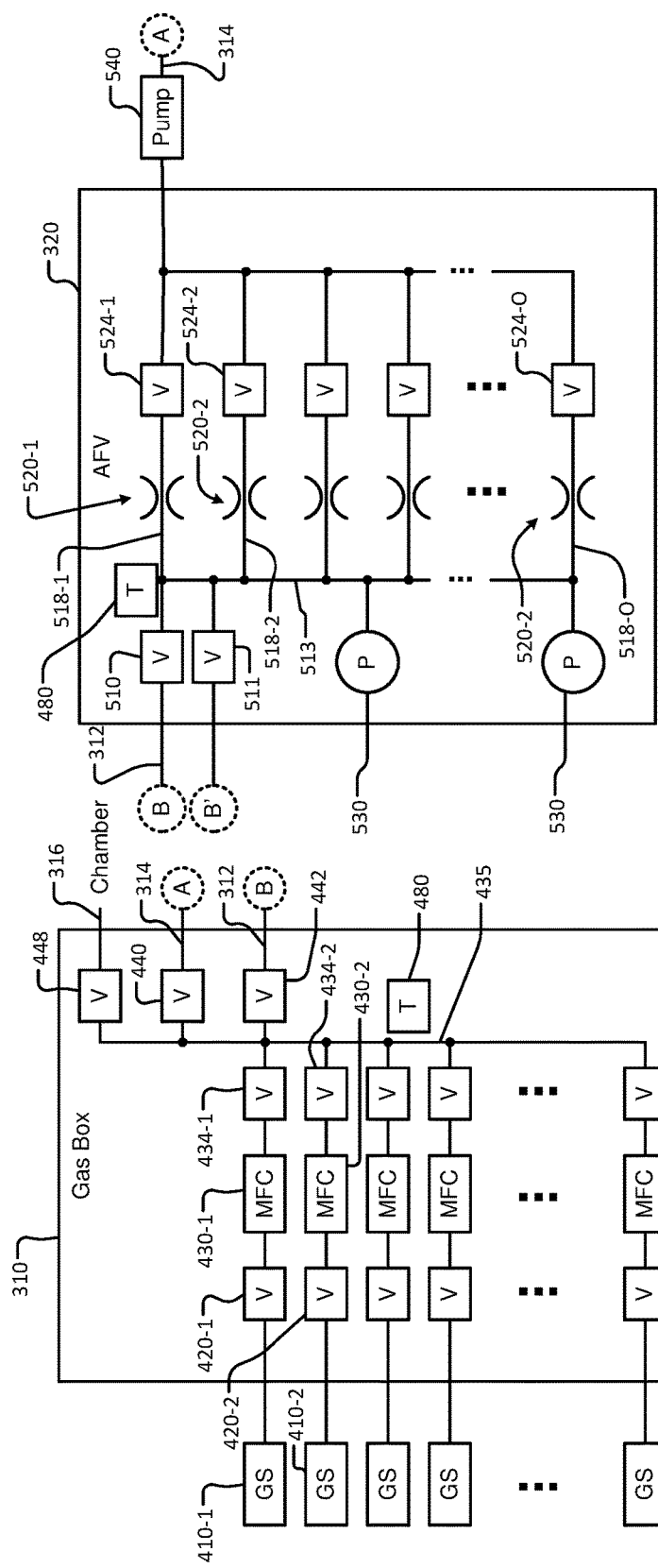
FIG. 5
FIG. 4
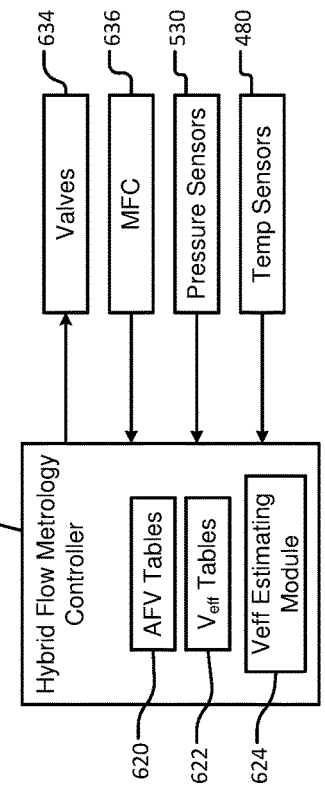
FIG. 6

HYBRID FLOW METROLOGY FOR IMPROVED CHAMBER MATCHING

FIELD

The present disclosure relates to flow metrology for substrate processing systems, and more particularly to a hybrid flow metrology for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, etching, deposition and cleaning processes. During processing, a substrate is arranged on a substrate support, such as a pedestal, an electrostatic chuck (ESC), etc. in a processing chamber of the substrate processing system. A gas delivery system supplies a gas mixture into the processing chamber to treat the substrate. Plasma may be struck to enhance chemical reactions within the processing chamber. An RF bias may also supplied to the substrate support to control ion energy.

To improve quality and reduce defects, one or more metrology systems may be used to verify operation of the processing chamber. For example, a flow metrology system may be used to verify flow rates of a gas delivery system supplying the gas mixture. When multiple substrate processing chambers are arranged in a substrate processing tool, gas lines are used to connect the gas delivery systems of the processing chambers to a multiplexed flow metrology system.

The flow metrology system may include an orifice-based, steady-state flow measurement device. Gas delivery systems are typically required to calibrate and supply flow rates from 10-3000 sccm. Gas flowing into the gas lines at low flow rates takes a long time to reach the flow metrology device and build up sufficient pressure for measurement, which adversely impacts measurement times during tool-startup. In other words, calibrating flow rates from 10 to a few hundred sccm take a long time. More recently, process recipes also require calibration and supply of flow rates from 0.1-10 sccm. As can be appreciated, unacceptable time delays may occur during calibration or chamber matching of the lower flow rates from 0.1 to 10 sccm using the orifice-based method.

SUMMARY

A gas flow metrology system for a substrate processing system includes N primary valves selectively flowing gas from N gas sources, respectively, where N is an integer. N mass flow controllers are connected to the N primary valves, respectively, to flow N gases from the N gas sources, respectively. N secondary valves selectively flow gas from the N mass flow controllers, respectively. A gas flow path connects the N secondary valves to a flow metrology system located remote from the N secondary valves, wherein the gas flow path includes a plurality of gas lines. A controller is configured to perform a hybrid flow metrology by selectively using a first flow metrology and a second flow metrology that is different from the first flow metrology to determine an actual flow rate for a selected gas at a desired flow rate from one of the N mass flow controllers.

In other features, the controller is further configured to perform the first flow metrology by evacuating the gas flow path; measuring an initial pressure in the gas flow path; determining an initial mass in the gas flow path; flowing the selected gas at the desired flow rate from the one of the N mass flow controllers during a predetermined period; measuring a final pressure in the gas flow path; determining a final mass in the gas flow path; and determining an actual flow rate based on the initial mass, the final mass, and the predetermined period.

In other features, the controller is further configured to determine an effective volume of the gas flow path for the selected gas and the desired flow rate. The controller is further configured to determine the actual flow rate further based on the effective volume.

In other features, the gas flow path further comprises a manifold and a valve. The controller is configured to use the first flow metrology when determining the actual flow rate when the desired flow rate is less than or equal to a predetermined flow rate. The predetermined flow rate is in a range from 5 sccm to 15 sccm. The controller is configured to use the second flow metrology when determining the actual flow rate when the desired flow rate is greater than the predetermined flow rate. The predetermined flow rate is in a range from 5 sccm to 15 sccm.

In other features, the second flow metrology includes an orifice-based metrology. A valve is connected to an outlet of the orifice. A pressure sensor senses pressure at an inlet of the orifice. The controller is configured to use the second flow metrology to determine the actual flow rate based on information associated with the valve, the pressure sensor and the orifice. The controller is configured to wait for a first predetermined settling period after evacuating the gas flow path before measuring the initial pressure in the gas flow path.

In other features, the controller is configured to wait for a second predetermined settling period after flowing the selected gas at the desired flow rate from the one of the N mass flow controllers during the predetermined period before measuring the final pressure in the gas flow path. The controller determines a difference between the actual flow rate determined by the first flow metrology and the actual flow rate determined by the second flow metrology.

In other features, the controller compares the difference to a predetermined range and selectively generates a notification when the difference is outside of the predetermined range. The controller is further configured to determine an effective volume of the gas flow path for the selected gas and the desired flow rate using the second flow metrology.

A hybrid flow metrology system comprises a connection configured to provide fluid communication with a gas flow path, wherein the gas flow path is in fluid communication with a gas box including N mass flow controllers to control flow of gas from N gas sources, respectively, where N is an integer. A controller is configured to perform a first flow metrology to calibrate at least one of the N mass flow controllers based on a differential mass of gas in the gas flow path between the gas box and the hybrid flow metrology system during a predetermined period when a desired flow rate for gas supplied by the at least one of the N mass flow controllers is less than or equal to a predetermined flow rate. The controller is configured to perform a second flow metrology to calibrate the at least one of the N mass flow controllers when the desired flow rate for the gas supplied by the at least one of the N mass flow controllers is greater than the predetermined flow rate.

In other features, the first flow metrology and the second flow metrology are used to determine an effective volume of the gas flow path for the gas at the desired flow rate. The first flow metrology further determines the differential mass based on the effective volume of the gas flow path for the gas at the desired flow rate.

In other features, the second flow metrology is an orifice-based method. The controller is further configured to determine an effective volume of the gas flow path for a selected gas and a selected flow rate. The controller is further configured to determine an actual flow rate further based on the effective volume. The gas flow path further comprises a manifold and a valve. The predetermined flow rate is in a range from 5 sccm to 15 sccm.

In other features, a valve is connected to an outlet of an orifice. A pressure sensor senses pressure at an inlet of the orifice. The controller is further configured to use information associated with the valve, the pressure sensor and the orifice to determine an actual flow rate when the desired flow rate is greater than the predetermined flow rate.

In other features, the controller is configured to perform the first flow metrology by evacuating the gas flow path; measuring an initial pressure in the gas flow path; determining an initial mass in the gas flow path; flowing a selected gas at the desired flow rate from the at least one of the N mass flow controllers during the predetermined period; measuring a final pressure in the gas flow path; determining a final mass in the gas flow path; and determining an actual flow rate based on the initial mass, the final mass, and the predetermined period.

In other features, the controller is configured to wait for a first predetermined settling period after evacuating the gas flow path before measuring the initial pressure in the gas flow path. The controller is configured to wait for a second predetermined settling period after flowing the selected gas at the desired flow rate from the at least one of the N mass flow controllers during the predetermined period before measuring the final pressure in the gas flow path.

A method performs gas flow metrology in a substrate processing system including a gas box including N mass flow controllers to control flow of gas from N gas sources, respectively, where N is an integer and a gas flow path in fluid communication with the gas box. The method includes setting a desired flow rate for a gas supplied by at least one of the N mass flow controllers; using a first flow metrology to calibrate the at least one of the N mass flow controllers based on a differential mass of the gas in the gas flow path between the gas box and a flow metrology system during a predetermined period when the desired flow rate is less than or equal to a predetermined flow rate; and using a second flow metrology to calibrate the at least one of the N mass flow controllers when the desired flow rate is greater than the predetermined flow rate.

In other features, the first flow metrology and the second flow metrology are used to determine an effective volume of the gas flow path for the gas at the desired flow rate. The first flow metrology further determines the differential mass based on the effective volume of the gas flow path for the gas at the desired flow rate. The second flow metrology is an orifice-based method. The predetermined flow rate is in a range from 5 sccm to 15 sccm. The first flow metrology includes evacuating the gas flow path; measuring an initial pressure in the gas flow path; determining an initial mass in the gas flow path; flowing a selected gas at the desired flow rate from the at least one of the N mass flow controllers during the predetermined period; measuring a final pressure in the gas flow path; determining a final mass in the gas flow path; and determining an actual flow rate based on the initial mass, the final mass, and the predetermined period.

In other features, the method includes waiting a first predetermined settling period after evacuating the gas flow path before measuring the initial pressure in the gas flow path. The method includes waiting a second predetermined settling period after flowing the selected gas at the desired flow rate from the at least one of the N mass flow controllers during the predetermined period before measuring the final pressure in the gas flow path.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 is a functional block diagram of an example of a gas box according to the present disclosure;

FIG. 5 is a functional block diagram of an example of a hybrid flow metrology system according to the present disclosure;

FIG. 6 is a functional block diagram of an example of a hybrid flow metrology controller according to the present disclosure;

In the drawings, reference numbers may be reused to identify similar and/or identical elements.

DETAILED DESCRIPTION

Figure 1:
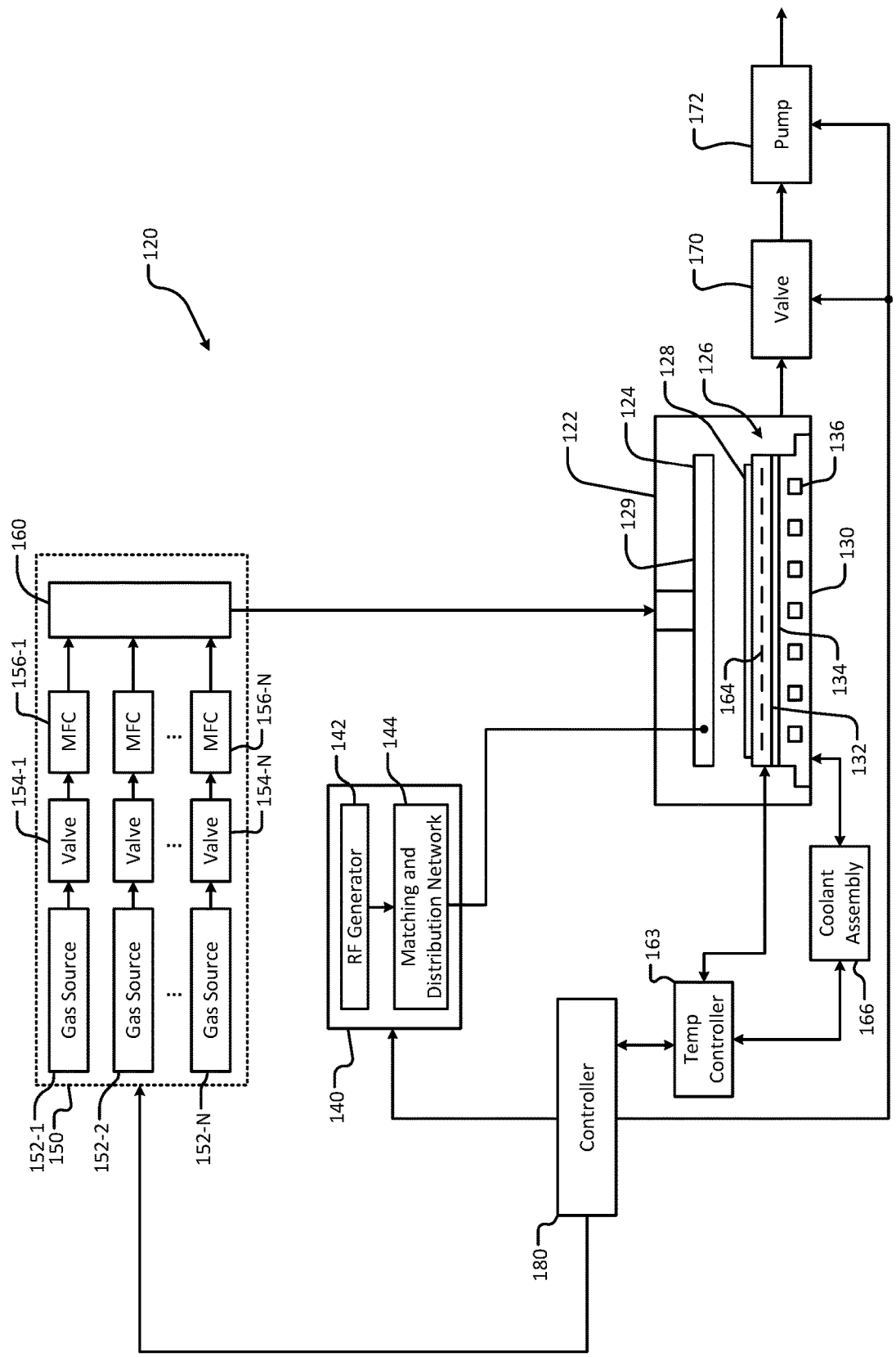
FIG. 1 is a functional block diagram of an example of a substrate processing system.

Orifice-based flow metrology systems such as absolute flow verification (AFV) supply gas from a mass flow controller (MFC) through an orifice bank to a pump. The orifice bank includes a plurality of precision orifices that can be selected using corresponding valves. Pressure builds upstream of a selected one of the orifices and is monitored by a pressure sensor such as a manometer. The pressure value is used to determine the flow rate based on an empirically developed gas table that relates orifice pressure to gas flow rate on a per gas basis. A temperature correction may also be applied to account for temperature variations and to determine the actual gas flow rate of the MFC.

The measurement time for AFV increases substantially at lower flow rates due to the time that is required to fill and pressurize a gas flow path downstream from the MFC and upstream from the selected orifice. The gas flow path typically includes the gas supply lines, manifolds, valves, etc. (located between the gas box and the flow metrology system). The long calibration period increases downtime required to perform gas flow calibration during initial setup and later during chamber matching. Detection of when the orifice flow has stabilized (to obtain steady state pressure) at very low flow rates and with longer gas supply lines is difficult. Small changes in pressure build-up are difficult to detect due to the increased volume of the gas lines.

Hybrid flow metrology systems and methods according to the present disclosure use a differential mass measurement (DMM) method for flow rates less than a predetermined flow rate and another flow metrology method for flow rates above the predetermined flow rate. In some examples, the predetermined flow rate is 10 sccm, although other flow rate values can be used. In some examples, orifice-based flow metrology is used for flow rates above the predetermined flow rate, although other flow metrology methods can be used.

As will be described further below, the DMM method fills the gas volume in gas lines, valves, manifolds, etc. between the gas box and the flow metrology system. In some examples, the gas volume is evacuated and an initial pressure is measured after a settling period. An initial mass is determined based on the initial pressure and an effective volume of the flow path through the gas lines, the manifold, the valves and/or other volumes located between the gas box and the flow metrology system.

After determining the initial mass, the valves are opened and the MFC flows gas at a desired flow rate (to be calibrated) for a predetermined period $\Delta t$. Pressure steadily increases inside of the gas volume between the gas box and the flow metrology system. After the predetermined period $\Delta t$, the valves are closed and a final pressure is measured. The final mass is calculated based on the final pressure. The flow rate is calculated by taking a difference between the final mass and the initial mass divided by $\Delta t$.

While the DMM method is similar to chamber rate of rise (ROR), the DMM method uses the volume of the gas lines, valves, manifold, etc. instead of chamber/tank volume to calculate the mass flow rates. In ROR, the governing equation for computing mass flow rate is obtained after taking time derivatives of the equation of state. The transient pressure and temperature are sampled over time during gas compression in the ROR tank and the pressure/temperature rate of change is computed.

More particularly, when performing the DMM method for low flow rates, the MFC gas flow is used to pressurize an enclosure of known volume V over a predetermined time period $\Delta t$. The initial and final gas pressure and temperature in the enclosure are used to compute the net gas mass supplied to the enclosure based on gas equation of state:

$$PV = mRTZ/MW \quad (1)$$

where P is pressure, V is volume, m is mass, MW is molecular weight, R is the Universal Gas Constant and Z is the gas compressibility at condition (p,T).

The equation for absolute gas flow rate Q is:

$$Q = \frac{\Delta m}{\Delta t} = \frac{(V)(MW)}{R\Delta t}\left(\frac{p_2}{T_2 Z_2} - \frac{p_1}{T_1 Z_1}\right) \quad (2)$$

where subscripts 1 and 2 denote the initial and final states, respectively.

Compressibility effects are important for polyatomic gases only and as the pressure and temperature approach atmospheric (ATM) conditions. The compressibility effects can be neglected though, even for polyatomic gases, since the MFC downstream pressure is sub-atmospheric and can be maintained one order of magnitude less than ATM pressure when pressurizing gas volume in the DMM method. Therefore, the flow rate equation simplifies to:

$$Q = \frac{(V)(MW)}{R\Delta t}\left(\frac{p_2}{T_2} - \frac{p_1}{T_1}\right) \quad (3)$$

In some examples, the gas in the enclosure is allowed to rest for a predetermined settling period prior to measuring the initial and final p and T. The settling period reduces the effect of kinetic energy of the gas, which eliminates pressure gradients due to gas flow. The settling period also allows the gas temperature to stabilize with the environment. In other words, the gas is heated or cooled by the surrounding enclosure (wall temperature Tw), which eliminates effects due to gas expansion or compression, respectively.

Gas expansion phenomenon occurs at the beginning of the metrology calibration when the enclosure is evacuated to clear gas remnants (from previous measurements). As the gas is supplied in the enclosure, the gas undergoes compression heating which increases temperature. Since it is not realistic to use fast temperature sensors in the gas path (due to the risk for potential sensor damage from exposure to corrosive gases), accurate measurement of direct gas temperature is not possible.

If the gas is allowed to stabilize during the settling period, the initial and final gas temperatures will be the same as the initial and final wall temperatures, $T_{w_1}$ and $T_{w_2}$ respectively. Similarly, the initial and final pressures (p1 and p2) adjust to $\bar{p}_1$ and $\bar{p}_2$, respectively, due to the elimination of pressure gradients along the length of the gas supply line and change in gas temperature. As a result, the flow rate equation simplifies to:

$$Q = \frac{(V)(MW)}{R\Delta t}\left(\frac{\bar{p}_2}{T_{w_2}} - \frac{\bar{p}_1}{T_{w_1}}\right) \quad (4)$$

As described above, the enclosure for the DMM method (internal volumes of the gas lines, valves, manifold, etc.) behaves differently than the enclosure for ROR. In the ROR method, the effective volume V is the same as the actual volume of the tank. However, experimental testing of the enclosure for the DMM method (the gas lines, valves, manifold, etc.) resulted in errors. In other words, the effective volume $V_{eff}$ (calculated using a known flow rate) is significantly different than the expected internal volume.

Some of the difference in volume is attributable to variations in geometric manufacturing tolerances. Also, experimentation shows that the calibrated effective volume $V_{eff}$ may be different for different gases and flow rates. These differences may be attributed to various other factors. For example, the differences may be attributable to the relatively small volume of the gas supply line (which is affected more significantly by variations in manufacturing tolerances of the gas lines, internal valves and/or substrate volumes). Differences may also be attributable to the overall complex geometry of the supply volume assembly (long tubular shape with internal valves) as compared to the simple, uniform geometry of the tank used in the ROR method.

The ROR method uses a tank having a much larger volume as compared to the gas flow path including the gas supply line. The pressure gradients in the gas supply lines due to gas flow viscous effects have considerable effect and will cause inaccuracy in the mass flow rate calculation if they are not properly accounted for. Therefore, the ROR method is not applicable when using the volume of the gas lines as the enclosure and with a single point for pressure measurement.

This problem, however, can be resolved empirically by using a calibrated effective volume $V_{eff}$ (rather than the theoretical actual volume) for each gas and/or flow rate. As will be described further below, the orifice technology or another flow metrology method can be employed to compute the calibrated effective volume.

More particularly, the effective volume $V_{eff}$ can be calculated using equation 4. Initially, the corresponding MFC is set to one of the low flow rate set points and the DMM method is performed. During the DMM method, the initial and final pressures and temperatures are measured. The MFC is operated at the same flow rate set point (with the same gas) using the orifice-based method. The orifice-based method provides the absolute (true) flow rate Q of the MFC. The effective volume $V_{eff}$ is determined using equation 4, the absolute flow rate Q and the initial and final pressures and temperatures.

The calculations for the effective volume are required only once during initial tool startup and only for gases with low flow rates. The one-time calibration will also account for variations in manufacturing tolerances of the gas supply line from tool-to-tool for chamber flow matching. Therefore, chamber matching can be performed more quickly using the proposed hybrid flow metrology. Furthermore, calibrating the DMM method (used for low flow rates) with the orifice technology method (used for higher flow rates) ensures that there is no discrepancy at the flow rate junction or overlap when switching between the two methods. Another advantage of the proposed hybrid flow metrology is that the calculation at the flow rate junction can be tracked and monitored as an additional system health check to ensure there is no drift in accuracy over time.

Additional details relating to AFV can be found in commonly-assigned U.S. Pat. No. 7,822,570, which issued on Oct. 26, 2010 and is entitled "Methods for Performing Actual Flow Verification", which is hereby incorporated by reference in its entirety. Additional details relating to ROR can be found in commonly-assigned U.S. Pat. No. 9,778,083.

Referring now to FIG. 1, an example substrate processing system 120 is shown. While an example of a processing chamber for etching, chemical vapor deposition or atomic layer deposition (ALD) using capacitively coupled plasma (CCP) is shown, the flow metrology systems and methods described herein can be used in any other type of system or substrate processing system. For example, the flow metrology systems and methods described herein can be used in substrate processing systems using remote plasma or inductively coupled plasma (ICP). Additionally, the systems and methods described herein can be used in any other semiconductor equipment where precise flow metrology would be desirable or required.

The substrate processing system 120 includes a processing chamber 122 that encloses other components of the substrate processing system 120 and contains the RF plasma (if used). The substrate processing system 120 includes an upper electrode 124 and a substrate support 126 such as an electrostatic chuck (ESC). During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130.

If plasma is used, an RF generating system 140 generates and outputs an RF voltage to one of the upper electrode 124 and the lower electrode (e.g., the baseplate 130 of the ESC 126). The other one of the upper electrode 124 and the baseplate 130 may be DC grounded, AC grounded or floating. For example only, the RF generating system 140 may include an RF generator 142 that generates RF power that is fed by a matching and distribution network 144 to the upper electrode 124 or the baseplate 130. In other examples, the plasma may be generated inductively or remotely.

A typical gas delivery system 150 includes one or more gas sources 152-1, 152-2, . . . , and 152-N (collectively gas sources 152), where N is an integer greater than zero. The gas sources 152 are connected by valves 154-1, 154-2, . . . , and 154-N (collectively valves 154) and MFCs 156-1, 156-2, . . . , and 156-N (collectively MFCs 156) to a manifold 160. Secondary valves may be used between the MFCs 156 and the manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126. A valve 170 and pump 172 may be used to evacuate reactants from the processing chamber 122. A system controller 180 may be used to control components of the substrate processing system 120.

Figure 2:
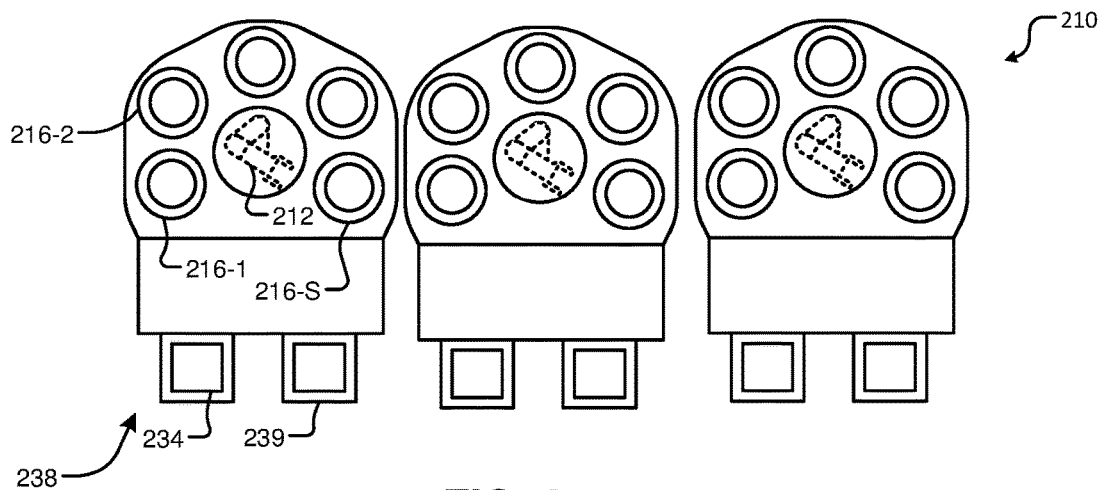
FIG. 2 is a functional block diagram of an example of substrate processing tools.

Referring now to FIG. 2, the flow metrology systems and methods described herein can be used to provide flow metrology for gas supplied to one or more substrate processing tools 210 to reduce cost. While an example of a substrate processing tool 210 is shown, other substrate processing tools can be used.

The substrate processing tool 210 includes a robot 212 arranged in a central location. The robot 212 may be operated at vacuum or atmospheric pressure. The substrate processing tool 210 includes a plurality of stations (or substrate processing chambers) 216-1, 216-2, ..., and 216-S (collectively stations 216) (where S is an integer greater than one) arranged around the robot 212. The stations 216 may be arranged around a center of the substrate processing tool 210 with an equal or irregular angular offset. Examples of stations 216 may include one or more of deposition, etch, pre-clean, post clean, spin clean, etc.

The substrates may be initially located in a cassette 234. A robot and load lock generally identified at 238 may be used to move the substrates from the cassette 234 to the substrate processing tool 210 for processing. When processing is complete, the robot and load lock 238 may return the substrates to the cassette 234 and/or another cassette 239. As will be described further below, gas delivery systems supply gas to the stations 216 and a flow metrology system calibrates the gas flows.

Figure 3:
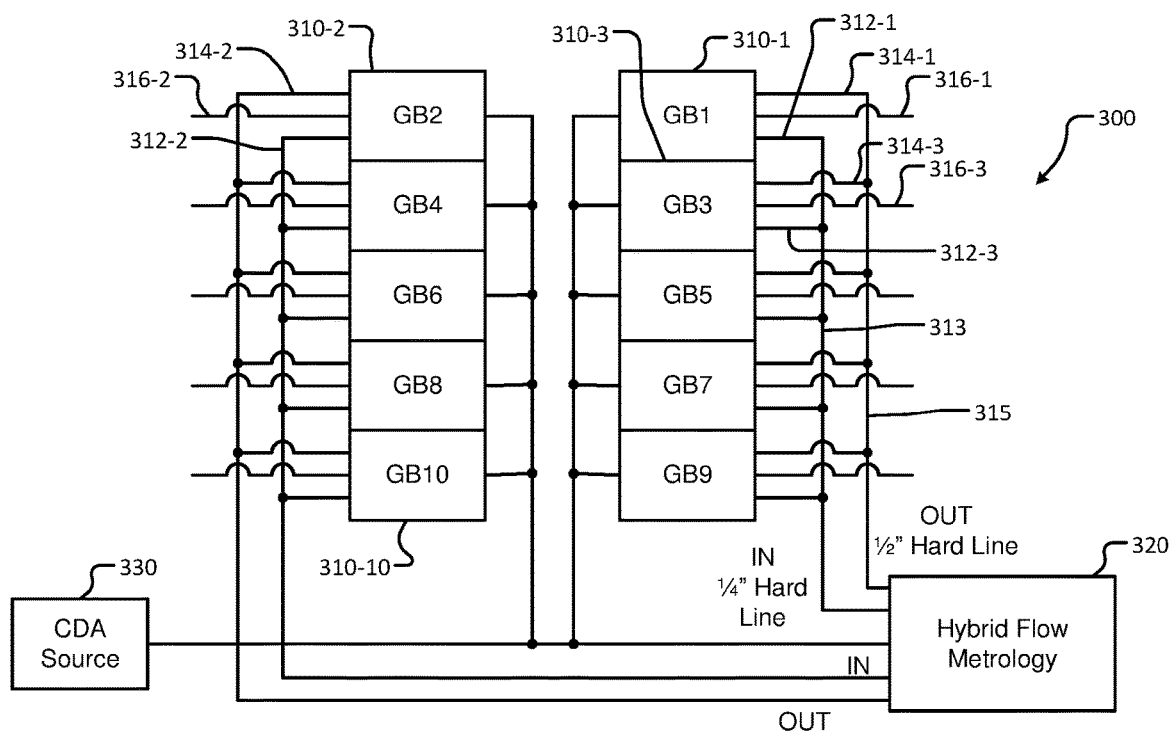
FIG. 3 is a functional block diagram of a gas delivery system according to the present disclosure that can be used in the systems of FIGS. 1 and 2.

Referring now to FIG. 3, a gas delivery system 300 including a plurality of gas boxes 310-1, 310-2, ... 310-10 (collectively gas boxes 310) is shown. While ten (10) gas boxes are shown, the gas delivery system 300 can include additional or fewer gas boxes. The gas boxes 310-1, 310-2, ... 310-10 are connected by first gas lines 312-1, 312-2, ... 312-10 (collectively first gas lines 312) to a hybrid flow metrology system 320. The first gas lines 312 may be connected to a manifold 313 and then routed to the hybrid flow metrology system 320. Return gases from the hybrid flow metrology system 320 are connected by second gas lines 314-1, 314-2, ... 314-10 (collectively second gas lines 314) to the gas boxes 310-1, 310-2, ... 310-10. The second gas lines 314 flow out of the hybrid flow metrology system 320 into a manifold 315 and are separated into individual lines that are connected to the gas boxes 310-1, 310-2, ... 310-10.

Gas lines 316-1, 316-2, ... 316-10 (collectively gas lines 316) connect outputs of the gas boxes 310-1, 310-2, ... 310-10 to processing chambers. In some examples, a source of clean dry air (CDA) 330 is also connected to the gas boxes 310-1, 310-2, ... 310-10. As can be appreciated, the hybrid flow metrology system 320 is shared or time multiplexed by the gas boxes 310-1, 310-2, ... 310-10, which reduces cost.

Referring now to FIG. 4, one of the gas boxes 310 is shown. Gas sources 410-1, 410-2, ..., and 410-G (collectively gas sources 410) are connected to flow control devices including primary valves 420-1, 420-2, ..., and 420-G (where G is an integer greater than 1) (collectively primary valves 420), mass flow controllers (MFC) 430-1, 430-2, ... 430-G (collectively MFC 430), and secondary valves 434-1, 434-2, ..., and 434-G (collectively secondary valves 434). Outputs of the secondary valves 434 are connected to a mixing manifold 435 and are input to the valves 440, 442 and 448. The valves 440, 442 are connected to the hybrid flow metrology system 320. The valve 442 is associated with gas flowing to the hybrid flow metrology system 320 in the gas lines 312. The valve 440 is associated with gas returning from the hybrid flow metrology system 320 in the gas lines 314. The valve 448 is associated with gas flowing in the gas lines 316 to the processing chamber associated with the gas box 310. One or more temperature sensors 480 can be used to sense a temperature of the gas lines. In some examples, portions of the gas lines are heated by resistive heaters (not shown).

Referring now to FIG. 5, a portion of a hybrid flow metrology system 320 is shown. An inlet B to the hybrid flow metrology system 320 is connected to a valve 510. An inlet B' associated with the gas boxes GB2, GB4, GB6, GB8 and GB10 is connected to a valve 511. Outlets of the valves 510 and 511 are connected by a manifold 513 to a plurality of gas lines 518-1, 518-2, ..., and 518-O (where O is an integer greater than or equal to one) (collectively gas lines 518). The gas lines 518 are connected to precision orifices 520-1, 520-2, ..., and 520-O (collectively precision orifices 520).

In some examples, precision orifices 520 have varying orifice sizes. The precision orifices 520 are considered "precise" if the orifice has a predetermined known size and shape and is unobstructed. One or more pressure sensors 530 sense pressure upstream from the precision orifice 520 when the precision orifice 520 is operated in a choked flow condition. The choked flow condition occurs when gases exit the precision orifice 520 at sonic velocity. One of the precision orifices 520 is selected based on the flow rate to be calibrated.

The pressure sensors 530 are connected to an outlet of the valves 510 and 511 and inlets of the precision orifices 520. For example, a first one of the pressure sensors 530 operates in a first pressure range and a second one of the pressure sensors 530 operates in a second pressure range that is the same as or different than the first pressure range. For example, the first one of the pressure sensors 530 measures pressure up to 50 T and the second one of the pressure sensors 530 measures pressure up to 500 T, although other pressure ranges can be used. The precision orifices 520 are connected to inlets of valves 524-1, 524-2, ..., and 524-O (collectively valves 524). Outlets of the valves 524 are connected together and output to a pump 540.

Referring now to FIG. 6, a hybrid flow metrology controller 610 is shown. In some examples, the hybrid flow metrology controller 610 includes one or more AFV tables 620, one or more $V_{eff}$ tables 622 and a $V_{eff}$ estimating module 624. The AFV table 620 is an empirically developed table relating orifice pressure to flow rate on a per gas basis. The $V_{eff}$ table 622 includes $V_{eff}$ values that are calibrated and that are indexed by gas and/or desired flow rate.

The hybrid flow metrology controller 610 communicates with valves 634, mass flow controllers 636, the pressure sensors 530 and the temperature sensors 480. The hybrid flow metrology controller 610 controls the valves 634 based upon the feedback from the temperature sensors 480 and pressure sensors 530 as will be described further below. In some examples, the $V_{eff}$ estimating module 624 may be used to estimate $V_{eff}$ based on other calibrated $V_{eff}$ values using interpolation, formulas, or other techniques.

Figure 7B:
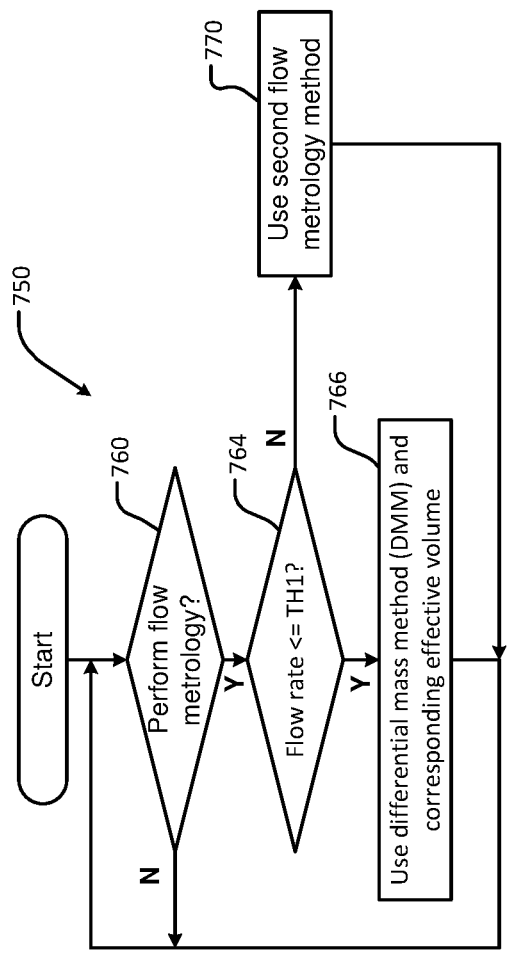
FIGS. 7A and 7B are flowcharts illustrating an example of a method for performing hybrid flow metrology according to the present disclosure.
Figure 7A:
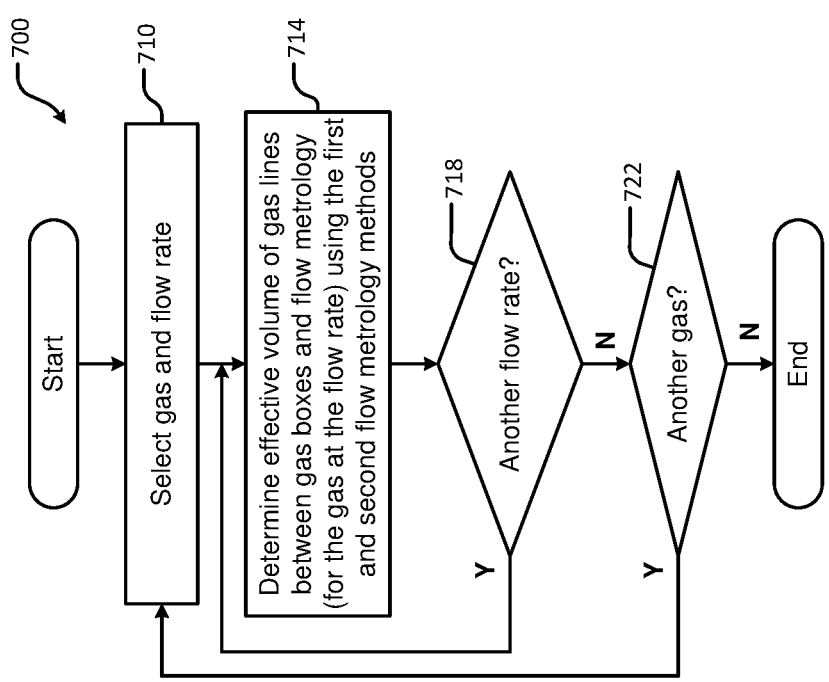

Referring now to FIGS. 7A and 7B, a method for performing hybrid flow metrology is shown. In FIG. 7A, a method 700 is performed to determine the calibrated effective volume for low flow rate gases. In other words, the calibrated effective volume only needs to be determined for gases that are to be supplied at flow rates that are less than a predetermined flow rate where the DMM method will be used. Furthermore, calibration may be performed for each of the flow rates and gases that are to be used. Alternately, one or more calibrations may be performed for one or more gases and one or more flow rates. Interpolation, formulas or other compensation may be used to determine flow rates for the other gases and/or at the other flow rates (less than the predetermined flow rate) without individual calibration thereof.

At 710, a gas and a flow rate are selected for calibration of the effective volume. At 714, the effective volume is determined for the selected gas at the selected flow rate using the first and second flow metrology methods, e.g., the DMM method and the orifice-based method respectively.

In some examples, the effective volume $V_{eff}$ can be calculated using equation 4. Initially, the corresponding MFC is set to one of the low flow rate set points and the DMM method is performed. During the DMM method, the initial and final pressures and temperatures are measured. The MFC is operated at the same flow rate set point (with the same gas) using the orifice-based method. The orifice-based method provides the absolute (true) flow rate Q of the MFC. The effective volume $V_{eff}$ is determined using equation 4, the absolute flow rate Q and the initial and final pressures and temperatures.

If additional samples are desired or required, the method continues at 718 and another flow rate for the selected gas is calibrated. When all of the flow rates are calibrated for the selected gas, the method continues at 722 and determines whether another gas is to be calibrated. If 722 is true, the method returns to 710. Otherwise, the method ends.

In FIG. 7B, a method 750 for operating the hybrid flow metrology system according to the present disclosure is shown. At 760, the method determines whether flow metrology is to be performed. If 760 is true, at 764, the method determines whether the desired flow rate to be calibrated is less than or equal to a first flow rate threshold TH1. If 764 is true, the method uses the DMM method and the calibrated effective volume corresponding to the selected gas and/or flow rate. If 764 is false, the method uses the second flow metrology method. In some examples, the second flow metrology method includes the orifice-based method.

Figure 8:
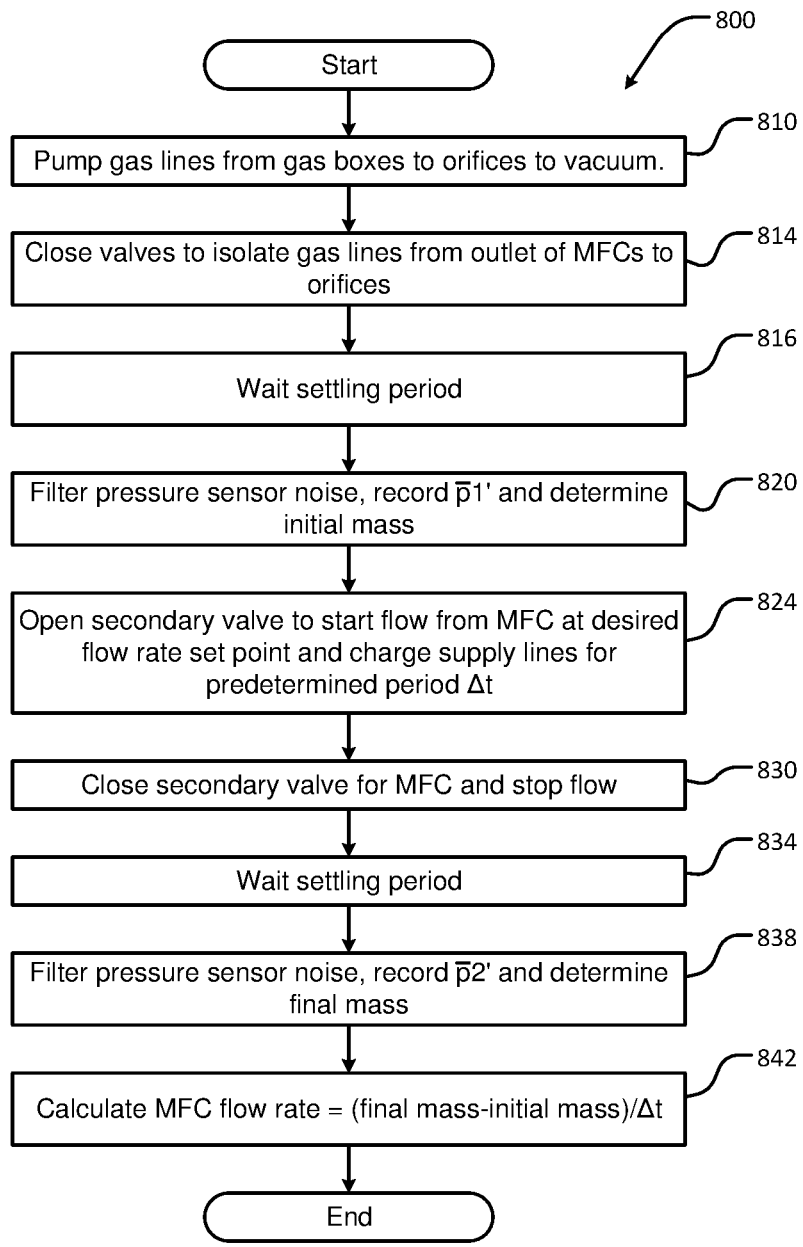
FIG. 8 is a flowchart illustrating an example of a differential mass method according to the present disclosure.

Referring now to FIG. 8, a method 800 for performing flow metrology is shown. At 810, the gas lines 312 are pumped from the gas boxes 310 to the orifice 520. At 814, the gas lines are isolated from the outlet of the MFCs 430 to the orifices 520. At 816, the method waits for a settling period to allow the kinetic energy to subside and the gas to reach the wall temperature. In some examples, the settling period is in a range from 10 seconds to 60 seconds. At 820, pressure sensor noise is filtered, pressure is measured and an initial mass is determined based on the measured pressure. At 824, a secondary valve 434 of the MFC 430 is opened and flow is supplied at a desired flow rate. The gas lines 312, the manifold 435 and other structures are charged at the desired flow rate output by the MFC 430 for a predetermined period Δt. At 830, the secondary valve 434 for the MFC 430 is closed and flow is stopped. At 834, the method waits for a settling period. At 838, pressure sensor noise is filtered, pressure is measured and a final mass is determined based on the measured pressure and the effective volume (for the selected gas and/or the selected flowrate). At 842, the flow rate is determined based upon the final mass, the initial mass and Δt.

Figure 9:
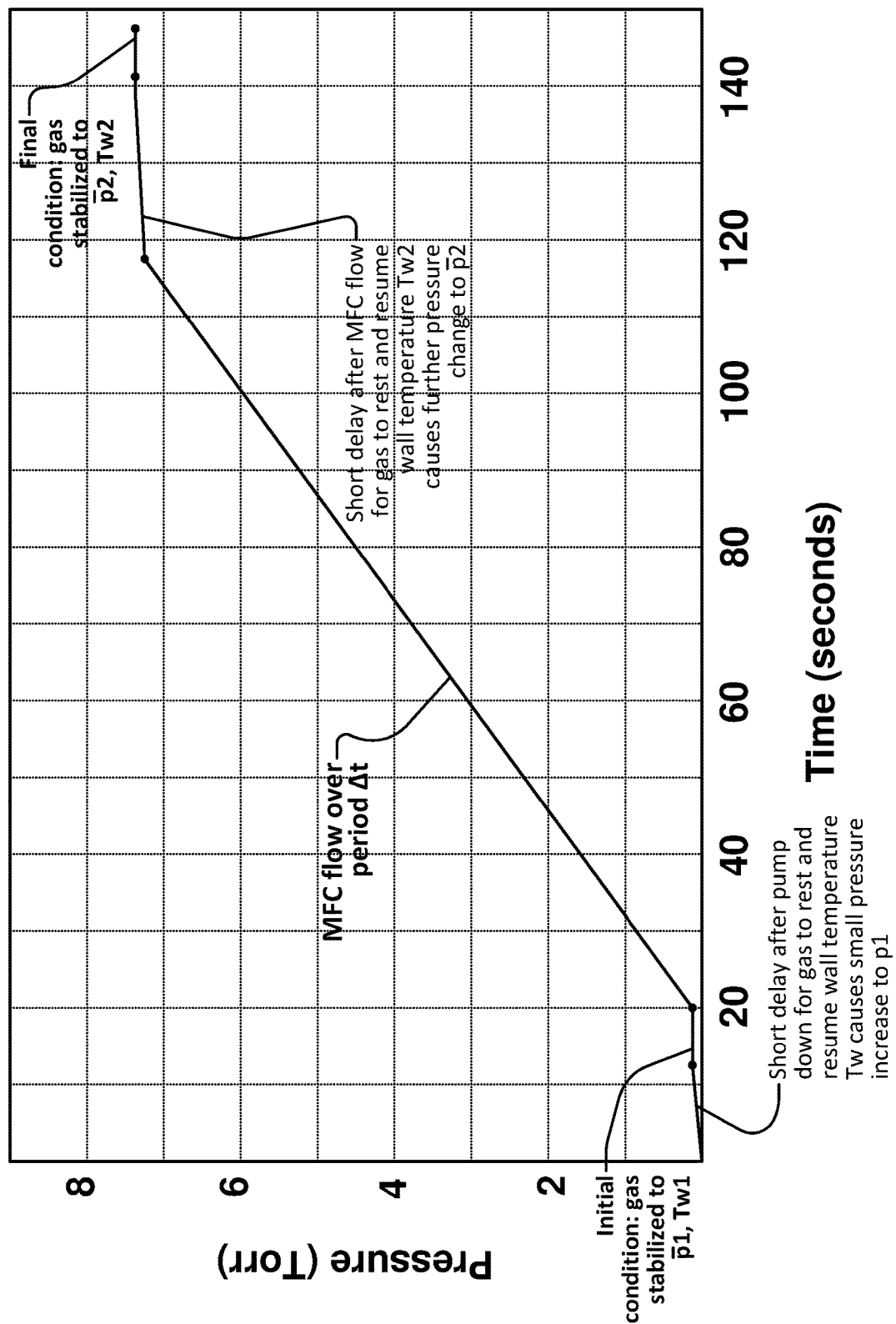
FIG. 9 is a graph illustrating pressure as a function of time during the differential mass method according to the present disclosure.

Referring now to FIG. 9, measured pressure is shown as a function of time for an example of the DMM method. After the gas lines are evacuated, the gas is allowed to rest and to reach an equilibrium temperature with surfaces such as the inner walls of the gas lines ($T_{w1}$), which causes a slight increase in the initial pressure $p_1$. Subsequently, the MFC is set to a desired flow rate that is to be calibrated for a period Δt. After the period Δt, the gas is allowed to rest to eliminate pressure gradients along the gas line and to reach an equilibrium temperature with surfaces such as the inner walls of the gas lines ($T_{w2}$), which causes a slight change in the final pressure $p_2$.

Figure 10:
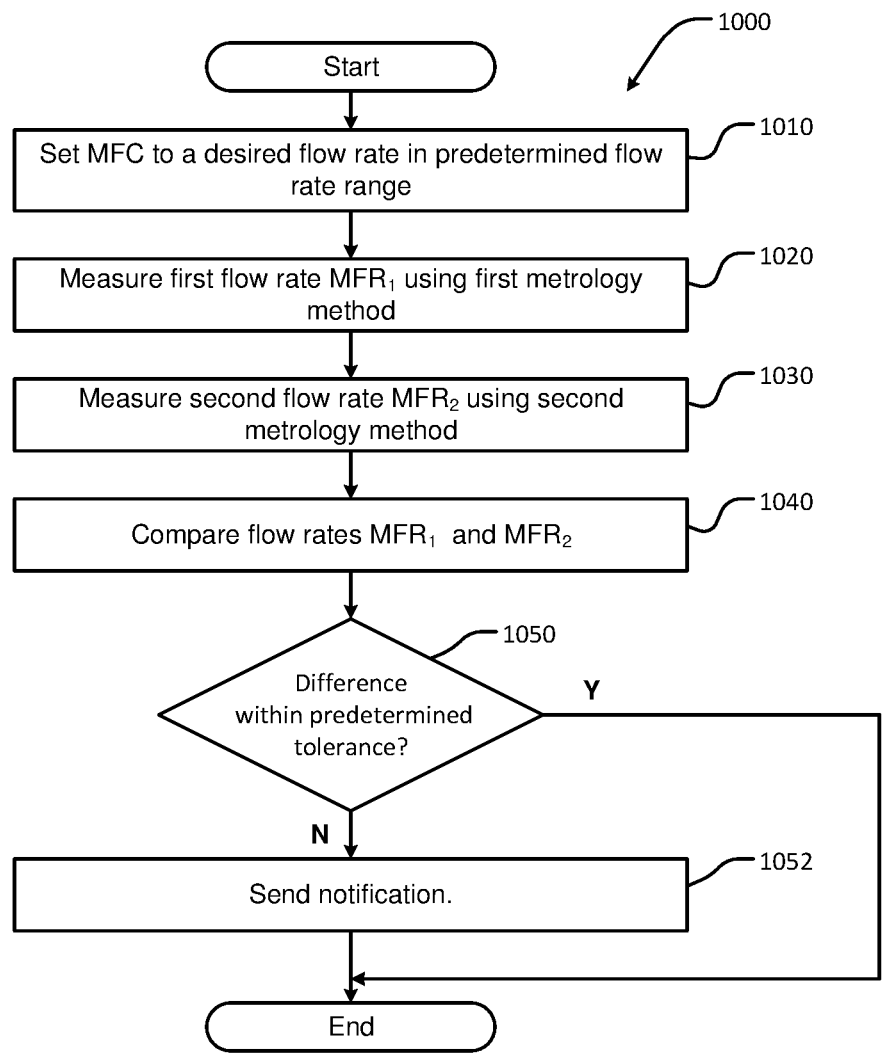
FIG. 10 is a flowchart illustrating an example of a method for using changes to effective volume calculations for a given gas over time as an additional metrology check according to the present disclosure.

Referring now to FIG. 10, a method 1000 for providing additional checks on the calibration of the MFC is shown. In some examples, during operation, the first flow metrology method? and the second flow metrology method? will have an overlap of one or more flow rates in a predetermined range that can be compared. For example, the first flow metrology method may be used to calibrate flow rates less than or equal to 10 sccm and the second flow metrology method may be used to calibrate flow rates greater than or equal to 10 sccm. In some examples, both the first flow metrology method and the second flow metrology method may be used to calibrate the same desired flow rate of the MFC. For example, both metrology methods can be used to calibrate 10 sccm.

The results of calibration using the first flow metrology method and the second flow metrology method can be compared. If the results are within a predetermined tolerance, the first and second flow metrology methods are performing correctly. If the results are not within the predetermined tolerance, the system sends a notification, generates a warning message, turns on a warning light and/or takes other remedial or corrective action.

At 1010, the MFC is set to flow a selected gas at a desired flow rate in a predetermined flow rate range. In some examples, the predetermined flow rate range is near the predetermined flow rate for switching between the first flow metrology method and the second flow metrology method. For example, the desired flow rate of the MFC can be in a range from 5 sccm to 15 sccm.

At 1020, a first flow rate $MFR_1$ is measured using the first flow metrology method. At 1030, a second flow rate $MFR_2$ is measured using the second flow metrology method. At 1040, the first and second flow rates $MFR_1$ and $MFR_2$ are compared. At 1050, the system determines whether the difference between the first and second flow rates $MFR_1$ and $MFR_2$ is less than a predetermined value or within a predetermined tolerance. If 1050 is true, the method ends. Otherwise, the system sends a notification, generates a warning message, turns on a warning light or takes other remedial or corrective action at 1052.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A gas flow metrology system for a substrate processing system, comprising:
   N primary valves selectively flowing gas from N gas sources, respectively, where N is an integer;
   N mass flow controllers connected to the N primary valves, respectively, to flow N gases from the N gas sources, respectively;
   N secondary valves selectively flowing gas from the N mass flow controllers, respectively;
   a gas flow path connecting the N secondary valves to a flow metrology system located remote from the N secondary valves, wherein the gas flow path includes a plurality of gas lines; and
   a controller configured to perform a hybrid flow metrology by selectively using a first flow metrology and a second flow metrology that is different from the first flow metrology to determine an actual flow rate for a selected gas at a desired flow rate from one of the N mass flow controllers.

2. The gas flow metrology system of claim 1, wherein the controller is further configured to perform the first flow metrology by:

evacuating the gas flow path;
measuring an initial pressure in the gas flow path;
determining an initial mass in the gas flow path;
flowing the selected gas at the desired flow rate from the one of the N mass flow controllers during a predetermined period;
measuring a final pressure in the gas flow path;
determining a final mass in the gas flow path; and
determining an actual flow rate based on the initial mass, the final mass, and the predetermined period.

3. The gas flow metrology system of claim 2, wherein the controller is further configured to determine an effective volume of the gas flow path for the selected gas and the desired flow rate.

4. The gas flow metrology system of claim 3, wherein the controller is further configured to determine the actual flow rate further based on the effective volume.

5. The gas flow metrology system of claim 1, wherein the gas flow path further comprises a manifold and a valve.

6. The gas flow metrology system of claim 1, wherein the controller is configured to use the first flow metrology when determining the actual flow rate when the desired flow rate is less than or equal to a predetermined flow rate.

7. The gas flow metrology system of claim 6, wherein the predetermined flow rate is in a range from 5 sccm to 15 sccm.

8. The gas flow metrology system of claim 6, wherein the controller is configured to use the second flow metrology when determining the actual flow rate when the desired flow rate is greater than the predetermined flow rate.

9. The gas flow metrology system of claim 8, wherein the predetermined flow rate is in a range from 5 sccm to 15 sccm.

10. The gas flow metrology system of claim 8, wherein the second flow metrology includes an orifice-based metrology.

11. The gas flow metrology system of claim 8, further comprising:
an orifice;
a valve connected to an outlet of the orifice; and
a pressure sensor to sense pressure at an inlet of the orifice,
wherein the controller is configured to use the second flow metrology to determine the actual flow rate based on information associated with the valve, the pressure sensor and the orifice.

12. The gas flow metrology system of claim 2, wherein the controller is configured to wait for a first predetermined settling period after evacuating the gas flow path before measuring the initial pressure in the gas flow path.

13. The gas flow metrology system of claim 12, wherein the controller is configured to wait for a second predetermined settling period after flowing the selected gas at the desired flow rate from the one of the N mass flow controllers during the predetermined period before measuring the final pressure in the gas flow path.

14. The gas flow metrology system of claim 12, wherein the controller determines a difference between the actual flow rate determined by the first flow metrology and the actual flow rate determined by the second flow metrology.

15. The gas flow metrology system of claim 14, wherein the controller compares the difference to a predetermined range and selectively generates a notification when the difference is outside of the predetermined range.

16. The gas flow metrology system of claim 1, wherein the controller is further configured to determine an effective volume of the gas flow path for the selected gas and the desired flow rate using the second flow metrology.

17. A hybrid flow metrology system comprising:
a connection configured to provide fluid communication with a gas flow path, wherein the gas flow path is in fluid communication with a gas box including N mass flow controllers to control flow of gas from N gas sources, respectively, where N is an integer; and
a controller configured to perform:
a first flow metrology to calibrate at least one of the N mass flow controllers based on a differential mass of gas in the gas flow path between the gas box and the hybrid flow metrology system during a predetermined period when a desired flow rate for gas supplied by the at least one of the N mass flow controllers is less than or equal to a predetermined flow rate; and
a second flow metrology to calibrate the at least one of the N mass flow controllers when the desired flow rate for the gas supplied by the at least one of the N mass flow controllers is greater than the predetermined flow rate.

18. The hybrid flow metrology system of claim 17, wherein the first flow metrology and the second flow metrology are used to determine an effective volume of the gas flow path for the gas at the desired flow rate.

19. The hybrid flow metrology system of claim 18, wherein the first flow metrology further determines the differential mass based on the effective volume of the gas flow path for the gas at the desired flow rate.

20. The hybrid flow metrology system of claim 17, wherein the second flow metrology is an orifice-based method.

21. The hybrid flow metrology system of claim 17, wherein the controller is further configured to determine an effective volume of the gas flow path for a selected gas and a selected flow rate.

22. The hybrid flow metrology system of claim 21, wherein the controller is further configured to determine an actual flow rate further based on the effective volume.

23. The hybrid flow metrology system of claim 17, wherein the gas flow path further comprises a manifold and a valve.

24. The hybrid flow metrology system of claim 17, wherein the predetermined flow rate is in a range from 5 sccm to 15 sccm.

25. The hybrid flow metrology system of claim 17, further comprising:
an orifice;
a valve connected to an outlet of the orifice; and
a pressure sensor to sense pressure at an inlet of the orifice,
wherein the controller is further configured to use information associated with the valve, the pressure sensor and the orifice to determine an actual flow rate when the desired flow rate is greater than the predetermined flow rate.

26. The hybrid flow metrology system of claim 17, wherein the controller is configured to perform the first flow metrology by:
evacuating the gas flow path;
measuring an initial pressure in the gas flow path;
determining an initial mass in the gas flow path;
flowing a selected gas at the desired flow rate from the at least one of the N mass flow controllers during the predetermined period;
measuring a final pressure in the gas flow path;

determining a final mass in the gas flow path; and determining an actual flow rate based on the initial mass, the final mass, and the predetermined period.

27. The hybrid flow metrology system of claim 26, wherein the controller is configured to wait for a first predetermined settling period after evacuating the gas flow path before measuring the initial pressure in the gas flow path.

28. The hybrid flow metrology system of claim 27, wherein the controller is configured to wait for a second predetermined settling period after flowing the selected gas at the desired flow rate from the at least one of the N mass flow controllers during the predetermined period before measuring the final pressure in the gas flow path.

* * * * *